US008404558B2

(12) United States Patent
Eden et al.

(10) Patent No.: US 8,404,558 B2
(45) Date of Patent: Mar. 26, 2013

(54) METHOD FOR MAKING BURIED CIRCUMFERENTIAL ELECTRODE MICROCAVITY PLASMA DEVICE ARRAYS, AND ELECTRICAL INTERCONNECTS

(75) Inventors: J. Gary Eden, Champaign, IL (US); Sung-Jin Park, Champaign, IL (US); Kwang-Soo Kim, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 13/188,712

(22) Filed: Jul. 22, 2011

(65) Prior Publication Data

US 2011/0275272 A1 Nov. 10, 2011

Related U.S. Application Data

(62) Division of application No. 11/880,698, filed on Jul. 24, 2007, now Pat. No. 8,004,017.

(60) Provisional application No. 60/833,405, filed on Jul. 26, 2006.

(51) Int. Cl.
*H01L 33/16* (2010.01)
*H01J 17/04* (2012.01)
*H01J 17/49* (2012.01)

(52) U.S. Cl. ........ 438/409; 438/688; 438/720; 205/112; 205/173; 313/582; 313/584; 313/631

(58) Field of Classification Search ........................ None
See application file for complete search history.

(56) References Cited

U.S. PATENT DOCUMENTS

| | | | |
|---|---|---|---|
| 3,551,303 | A | 8/1967 | Suzuki et al. |
| 5,441,627 | A | 8/1995 | Kato et al. |
| 5,792,517 | A | 8/1998 | Takeuchi et al. |
| 6,016,027 | A | 1/2000 | DeTemple et al. |
| 6,139,384 | A | 10/2000 | DeTemple et al. |
| 6,194,833 | B1 | 2/2001 | DeTemple et al. |
| 6,541,915 | B2 | 4/2003 | Eden et al. |

(Continued)

FOREIGN PATENT DOCUMENTS

| | | |
|---|---|---|
| GB | 2012305 | 7/1979 |
| JP | 04-129131 | 4/1992 |

(Continued)

OTHER PUBLICATIONS

Eden, et. al.., "Microplasma Devices Fabricated in Silicon, Ceramic, and Metal/Polymer Structures: Arrays, Emitters and Photodetectors", *Journal of Physics D: Applied Physics*, vol. 36, 2003, pp. 2869-2877.

(Continued)

*Primary Examiner* — Zandra Smith
*Assistant Examiner* — Pamela E Perkins
(74) *Attorney, Agent, or Firm* — Greer, Burns & Crain Ltd.

(57) ABSTRACT

In a preferred method of formation embodiment, a metal foil or film is obtained or formed with micro-holes. The foil is anodized to form metal oxide. One or more self-patterned metal electrodes are automatically formed and buried in the metal oxide created by the anodization process. The electrodes form in a closed circumference around each microcavity in a plane(s) transverse to the microcavity axis, and can be electrically isolated or connected. Preferred embodiments provide inexpensive microplasma device electrode structures and a fabrication method for realizing microplasma arrays that are lightweight and scalable to large areas. Electrodes buried in metal oxide and complex patterns of electrodes can also be formed without reference to microplasma devices—that is, for general electrical circuitry.

10 Claims, 10 Drawing Sheets

U.S. PATENT DOCUMENTS

| | | | | |
|---|---|---|---|---|
| 6,563,257 | B2 | 5/2003 | Vojak et al. | |
| 6,695,664 | B2 | 2/2004 | Eden et al. | |
| 6,815,891 | B2 | 11/2004 | Eden et al. | |
| 6,828,730 | B2 | 12/2004 | Eden et al. | |
| 6,867,548 | B2 | 3/2005 | Eden et al. | |
| 7,112,918 | B2 | 9/2006 | Eden et al. | |
| 7,126,266 | B2 | 10/2006 | Park et al. | |
| 2002/0014621 | A1 | 2/2002 | Den et al. | |
| 2002/0113553 | A1 | 8/2002 | Vojak et al. | |
| 2003/0080688 | A1 | 5/2003 | Eden et al. | |
| 2003/0132693 | A1 | 7/2003 | Eden et al. | |
| 2004/0058537 | A1 | 3/2004 | Yanagita et al. | |
| 2004/0100194 | A1 | 5/2004 | Eden et al. | |
| 2004/0206959 | A1 | 10/2004 | Heeger et al. | |
| 2005/0148270 | A1 | 7/2005 | Eden et al. | |
| 2005/0255313 | A1* | 11/2005 | Kyotani et al. | 428/338 |
| 2005/0269953 | A1 | 12/2005 | Eden et al. | |
| 2006/0038490 | A1 | 2/2006 | Eden et al. | |
| 2006/0071598 | A1 | 4/2006 | Eden et al. | |
| 2006/0082319 | A1 | 4/2006 | Eden et al. | |
| 2006/0084262 | A1 | 4/2006 | Qin | |
| 2006/0110294 | A1* | 5/2006 | Engstrom et al. | 422/100 |
| 2007/0108910 | A1 | 5/2007 | Eden et al. | |
| 2007/0170866 | A1 | 7/2007 | Eden et al. | |

FOREIGN PATENT DOCUMENTS

| | | |
|---|---|---|
| JP | 06-075219 | 3/1994 |
| JP | 06-310040 | 11/1994 |
| JP | 10-121292 | 5/1998 |
| JP | 2004211116 | 7/2004 |
| JP | 2005-256071 | 9/2005 |

OTHER PUBLICATIONS

Jessensky, et. al., "Self-Organized Formation of Hexagonal Pore Arrays in Anodic Alumina", *Applied Physics Letters*, vol. 72, No. 10, Mar. 9, 1998, pp. 1173-1175.

Masuda, et. al., "Ordered Metal Nanohole Arrays Made by a Two-Step Replication of Honeycomb Structures of Anodic Alumina", *Science*, vol. 268, No. 5216, Jun. 9, 1995, pp. 1466-1468.

Park, et. al., "Flexible Microdischarge Arrays: Metal/Polymer Devices", *Applied Physics Letters*, vol. 77, No. 7, Jul. 10, 2000, pp. 199-201.

Park, et. al., "Performance of Microdischarge Devices and Arrays with Screen Electrodes", *IEEE Photonics Technology Letters*, vol. 13, No. 1, Jan. 2001, pp. 61-63.

Park, et al., "Nanoporous alumina as a dielectric for microcavity plasma devices: Multilayer $Al/Al_2O_3$ structures", *Applied Physics Letters*, 2005, vol. 86.

Park, et al., "P-90: Large Scale Arrays for Microcavity Plasma Devices Based on Encapsulated $Al/Al_2O_3$ Electrodes: Device Characteristrics as a Plasma Display Pixel and Low Cose Wet Chemical Fabrication Processing", *SID*, 2007.

Kim et al., "27.3: Fully Addressable, Self Assembled Microcavity Plasma Arrays: Improved Luminous Efficacy by Controlling Device Geometry", *SID*, 2008.

* cited by examiner

METHOD FOR MAKING BURIED CIRCUMFERENTIAL ELECTRODE MICROCAVITY PLASMA DEVICE ARRAYS, AND ELECTRICAL INTERCONNECTS

PRIORITY CLAIM AND REFERENCE TO RELATED APPLICATION

This application claims priority under 35 U.S.C §120 from and is a divisional application of co-pending application Ser. No. 11/880,698, which was filed Jul. 24, 2007, and which claims priority under 35 U.S.C. §119 from provisional application Ser. No. 60/833,405 filed Jul. 26, 2006.

STATEMENT OF GOVERNMENT INTEREST

This invention was made with Government assistance under U.S. Air. Force Office of Scientific Research grant No. F49620-03-1-0391. The Government has certain rights in this invention.

FIELD OF THE INVENTION

The invention is in the field of microcavity plasma devices, also known as microdischarge devices or microplasma devices.

BACKGROUND

Microcavity plasma devices produce a nonequilibrium, low temperature plasma within, and essentially confined to, a cavity having a characteristic dimension d below approximately 500 μm. This new class of plasma devices exhibits several properties that differ substantially from those of conventional, macroscopic plasma sources. Because of their small physical dimensions, microcavity plasmas normally operate at gas (or vapor) pressures considerably higher than those accessible to macroscopic devices. For example, microplasma devices with a cylindrical microcavity having a diameter of 200-300 μm (or less) are capable of operation at rare gas (as well as $N_2$ and other gases tested to date) pressures up to and beyond one atmosphere.

Such high pressure operation is advantageous. An example advantage is that, at these higher pressures, the plasma chemistry favors the formation of several families of electronically-excited molecules, including the rare gas dimers ($Xe_2$, $Kr_2$, $Ar_2$, . . . ) and the rare gas-halides (such as XeCl, ArF, and $Kr_2F$) that are known to be efficient emitters of ultraviolet (UV), vacuum ultraviolet (VUV), and visible radiation. This characteristic, in combination with the ability of microplasma devices to operate in a wide range of gases or vapors (and combinations thereof), offers emission wavelengths extending over a broad spectral range. Furthermore, operation of the plasma in the vicinity of atmospheric pressure minimizes the pressure differential across the packaging material when a microplasma device or array is sealed.

Another unique feature of microplasma devices, the large power deposition into the plasma (typically tens of $kW/cm^3$ or more), is partially responsible for the efficient production of atoms and molecules that are well-known optical emitters. Consequently, because of the properties of microplasma devices, including the high pressure operation mentioned above and their electron and gas temperatures, microplasmas are efficient sources of optical radiation.

Research by the present inventors and colleagues at the University of Illinois has resulted in new microcavity plasma device structures as well as applications. As an example, semiconductor fabrication processes have been adapted to produce large arrays of microplasma devices in silicon wafers with the microcavities having the form of an inverted pyramid. Arrays with 250,000 devices, each device having an emitting aperture of 50×50 $\mu m^2$, have been demonstrated with a device packing density, array filling factor, and active area, of $10^4$ $cm^{-2}$, 25%, and 25 $cm^2$, respectively. Other microplasma device structures have been fabricated in ceramic multilayer structures, photodefinable glass, and more recently, $Al/Al_2O_3$ sheets.

Microcavity plasma devices have also been developed over the past decade for a wide variety of applications. An exemplary application for an array of microplasmas is in the area of displays. Since single cylindrical microplasma devices, for example, with a characteristic dimension (d) as small as 10 μm have been demonstrated, devices or groups of devices offer a spatial resolution that is desirable for a pixel in a display. In addition, the efficiency for generating, with a microcavity plasma device, the ultraviolet light at the heart of the plasma display panel (PDP) can exceed that of the discharge structure currently used in plasma televisions.

Early microplasma devices were driven by direct current (DC) voltages and exhibited short lifetimes for several reasons, including sputtering damage to the metal electrodes. Improvements in device design and fabrication have extended lifetimes significantly, but minimizing the cost of materials and the manufacture of large arrays continue to be key considerations. Also, more recently-developed, dielectric barrier microplasma devices excited by a time-varying voltage are preferable when lifetime is of primary concern.

Research by the present inventors and colleagues at the University of Illinois has pioneered and advanced the state of microcavity plasma devices. This work has resulted in practical devices with one or more important features and structures. Most of these devices are able to operate continuously with power loadings of tens of $kW\text{-}cm^{-3}$ to beyond 100 $kW\text{-}cm^{-3}$. One such device that has been realized is a multisegment linear array of microplasmas designed for pumping optical amplifiers and lasers. Also, the ability to interface a gas (or vapor) phase plasma with the electron-hole plasma in a semiconductor has been demonstrated. Fabrication processes developed largely by the semiconductor and microelectromechanical systems (MEMs) communities have been adopted for fabricating many of the microcavity plasma devices demonstrated to date. Use of silicon integrated circuit fabrication methods has further reduced the size and cost of microcavity plasma devices and arrays. Because of the batch nature of micromachining, not only are the performance characteristics of the devices improved, but the cost of fabricating large arrays is also reduced. The ability to fabricate large arrays with precise tolerances and high density makes these devices attractive for display applications.

This research by the present inventors and colleagues at the University of Illinois has resulted in exemplary practical devices. For example, semiconductor fabrication processes have been adopted to demonstrate densely packed arrays of microplasma devices exhibiting uniform emission characteristics. It has been demonstrated that such arrays can be used to excite phosphors in a manner analogous to plasma display panels, but with values of the luminous efficacy that are not presently achievable with conventional plasma display panels. Another important device is a microcavity plasma photodetector that exhibits high sensitivity.

The following U.S. patents and patent applications describe microcavity plasma devices resulting from these research efforts. Published Applications: 20050148270-Microdischarge devices and arrays; 20040160162-Microdischarge devices and arrays; 20040100194-Microdischarge photodetectors; 20030132693-Microdischarge devices and arrays having tapered microcavities; U.S. Pat. Nos. 6,867,548-Microdischarge devices and arrays; 6,828,730-Microdischarge photodetectors; 6,815,891-Method and apparatus for exciting a microdischarge; 6,695,664-Microdischarge devices and arrays; 6,563,257-Multilayer ceramic microdischarge device; 6,541,915-High pressure arc lamp assisted start up device and method; 6,194,833-Microdischarge lamp and array; 6,139,384-Microdischarge lamp formation process; and 6,016,027-Microdischarge lamp.

Additional exemplary microcavity plasma devices are disclosed in U.S. Published Patent Application 2005/0269953, entitled "Phase Locked Microdischarge Array and AC, RF, or Pulse Excited Microdischarge"; U.S. Published Patent Application no. 2006/0038490, entitled "Microplasma Devices Excited by Interdigitated Electrodes;" U.S. patent application Ser. No. 10/958,174, filed on Oct. 4, 2004, entitled "Microdischarge Devices with Encapsulated Electrodes,"; U.S. patent application Ser. No. 10/958,175, filed on Oct. 4, 2004, entitled "Metal/Dielectric Multilayer Microdischarge Devices and Arrays"; and U.S. patent application Ser. No. 11/042,228, entitled "AC-Excited Microcavity Discharge Device and Method."

The development of microcavity plasma devices continues, with an emphasis on the display, lighting and biomedical applications markets. The ultimate utility of microcavity plasma devices in displays will hinge on several critical factors, including efficacy (discussed earlier), lifetime and addressability. Addressability, in particular, is vital in most display applications. For example, for a group of microcavity discharges to act as a pixel, each microplasma device must be individually addressable.

Manufacturing of large area, microcavity plasma device arrays benefits from structures and fabrication methods that reduce cost and increase reliability. Of particular interest in this regard are the electrical interconnections between devices in a large array. If the interconnect technology is difficult to implement or if the interconnect pattern is not easily reconfigurable, then manufacturing costs are increased and potential commercial applications may be restricted. Such considerations are of growing importance as the demand rises for displays or light-emitting panels of ever increasing area.

SUMMARY OF THE INVENTION

In a preferred method of formation embodiment, a metal foil or film is obtained or formed with microcavities (such as through holes). The foil or film is anodized to form metal oxide. One or more self-patterned metal electrodes are automatically formed and buried in the metal oxide created by the anodization process. The electrodes form in a closed circumference around each microcavity, and can be electrically isolated or connected.

Patterns of electrode interconnections buried in a metal oxide layer provided by the invention also have separate utility as wiring for an electronic device or system. An embodiment of the invention is wiring for an electronic device or system comprising a plurality of microcavities defined in a first metal oxide layer. Circumferential metal first electrodes are buried in the metal oxide layer, each electrode surrounding an individual microcavity. Interconnections buried in the first metal oxide layer connect two or more of the first electrodes. The interconnection of the first electrodes is according to a pattern.

DETAILED DESCRIPTION OF THE PREFERRED EMBODIMENTS

Figure 1:
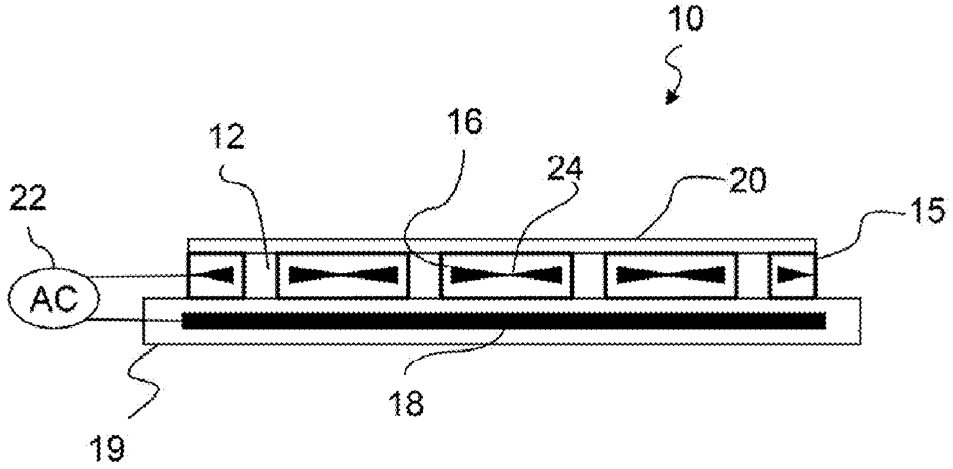
FIG. 1 is a schematic cross-sectional view of an exemplary embodiment microcavity plasma device array of the invention.

In a preferred method of formation embodiment, a metal foil or film is obtained or formed with microcavities (such as through holes). The foil or film is anodized to form metal oxide. One or more self-patterned metal electrodes are automatically formed and buried in the metal oxide created by the anodization process. The electrodes form in a closed circumference around each microcavity, and can be electrically isolated or connected.

A preferred embodiment microcavity plasma device array of the invention includes a plurality of first metal circumferential electrodes that surround microcavities in the array in a plane(s) transverse to the microcavity axes. The first circumferential electrodes are buried in a metal oxide layer and surround the microcavities, while being protected from plasma in the microcavities by the metal oxide. In embodiments of the invention, some or all of the circumferential electrodes are connected. Patterns of connections can be defined. A second electrode(s) is arranged so as to be isolated from said first electrodes by the first metal oxide layer. In some embodiments, the second electrode(s) is in a second layer, and in other embodiments the second electrode(s) is carried on or within the first metal oxide layer. A containing layer, e.g., a thin glass or plastic layer, seals discharge medium into the microcavities.

A preferred embodiment microcavity plasma device array of the invention includes a plurality of first metal circumferential electrodes that surround microcavities in the device in plane(s) transverse to the microcavities. The first circumferential electrodes are buried in a metal oxide layer, while being protected from plasma in the microcavities by the metal oxide layer. In embodiments of the invention, some or all of the circumferential electrodes are connected. Connection patterns can be defined.

A second electrode(s) is arranged so as to be isolated from said first electrodes by said first metal oxide layer. In some embodiments, the second electrode(s) is in a second layer, and in other embodiments the second electrode(s) is carried on or within the first metal oxide layer. In a preferred embodiment, a second electrode or a plurality of second electrodes are buried in a second dielectric layer. The second dielectric layer is bonded to, or brought in close proximity to, the first layer and a containing layer seals gas or vapor (or a combination thereof) within the array. In another preferred embodiment, the second electrode is a plurality of electrodes within the first metal oxide layer.

The second layer can include, for example, a common electrode. The second layer can be a solid thin metal foil buried in or encapsulated by oxide to define a common second electrode. In other embodiments, the second layer can include an electrode pattern, with or without microcavities. Preferably, the second layer is formed similarly to the first layer with metal circumferential buried electrodes. Such an array provides low capacitance and high switching speed. Microplasma device arrays of the invention can be flexible, lightweight and inexpensive.

In a preferred method of formation embodiment, a metal foil or film is obtained or formed with microcavities (such as through holes). The foil or film is anodized to form metal oxide. One or more self-patterned metal electrodes are automatically formed and buried in the metal oxide created by the anodization process. The electrodes form in a closed circumference around each microcavity, and can be electrically isolated or connected.

A preferred embodiment microplasma device array of the invention has at least a subset of the microcavities interconnected. First metal circumferential electrodes are buried in a metal-oxide (dielectric) layer and at least some of the first metal circumferential electrodes are interconnected. Metal-oxide also lines the inside of each microcavity so as to protect the first metal circumferential electrodes from exposure to the plasma. A second electrode(s) is also buried in a second metal-oxide dielectric layer which is brought in close proximity to the first layer with the first electrode and the microcavity array. This second electrode can, for example, comprise parallel metal lines buried in dielectric, each of which is intended to be associated with a specific row or column of microcavities in the array. The second electrode can, alternatively, be a continuous sheet of metal buried in a dielectric. Microcavities may or may not be formed in the second electrode.

Microcavity devices and arrays are provided by embodiments of the invention in which planar circumferential metal electrodes, lying in a plane(s) transverse to a plurality of microcavities, provide power to and interconnections among the microcavities. Electrodes are buried in a dielectric, such as a metal oxide, and surround each microcavity. The shape of the electrode around the microcavity essentially replicates the cross-sectional geometry of the microcavity (circular, diamond, etc.). A thin wall of the dielectric lies between the electrode and the edge of the microcavity, thereby electrically insulating the electrode and providing chemical and physical isolation of the electrode from the plasma within the microcavity. That is, the electrode is not flush with the microcavity wall.

A preferred embodiment includes a plurality of first circumferential electrodes buried in a dielectric and some or all of these electrodes are connected. A second electrode is buried in a second dielectric layer. The second dielectric layer is bonded or otherwise brought in proximity to the first layer, forming an array of devices, and a containing layer seals gas or vapor (or a combination thereof) within the array. In embodiments of the invention, the electrodes associated with different microcavities can be interconnected in patterns that are controllable.

In a preferred method of formation, the patterning of electrode interconnections between microcavities occurs automatically during the course of wet chemical processing (anodization) of a metal electrode. Prior to processing, microcavities (such as through holes) of the desired shape are produced in a metal electrode (e.g., a foil or film). The electrode is subsequently anodized so as to convert virtually all of the electrode into a dielectric (normally an oxide). The anodization process and microcavity placement determines whether adjacent microcavities in an array are electrically connected or not.

Relative to previous microcavity plasma technologies, this invention has several advantages. One is that the capacitance of the two electrode structure is reduced because the first electrodes and interconnections, if any, (and, in some preferred embodiments, the second electrode as well) is not a continuous sheet as has been the case with most previous technology. Much of the metal sheet that, in former microplasma devices and arrays, would constitute one electrode, is converted in this invention into a metal oxide dielectric. Since the capacitance of a parallel plate capacitor is proportional to the electrode area, the reduction in electrode area similarly reduces the capacitance of the overall structure. The reduction in capacitance similarly reduces the displacement current of an array which renders this technology of value for display applications in which large displacement currents are generally a liability.

Another advantage of embodiments of the present invention is that the dielectric can be a material with a large bandgap and, hence, is transparent in the visible and, perhaps, in portions of the ultraviolet (UV) or infrared (IR) regions as well.

With preferred formation methods, the buried circumferential metal electrodes form as self-patterned electrodes. The self-patterned electrodes can provide for the delivery of electrical power to, and interconnections among, microcavity plasma devices. Circumferential electrodes are buried in a metal oxide dielectric and surround each microcavity. The shape of the circumferential electrode surrounding a microcavity essentially replicates the cross-sectional geometry of the microcavity (circular, diamond, etc.)—that is, the electrode shape essentially matches that of a cut-away view of the microcavity by a plane that is transverse to the microcavity axis. A thin wall of the metal oxide dielectric lies between the electrode and the edge of the microcavity, thereby electrically insulating the electrode and providing chemical and physical isolation of the electrode from the plasma within the microcavity. In embodiments of the invention, the electrodes associated with different microcavities can be interconnected in patterns that are controllable. In the preferred method of formation, the patterning of electrode interconnections between microcavities occurs automatically during the course of wet chemical processing (anodization) of a metal foil or film. Prior to processing, microcavities of the desired shape are produced in a metal foil or film. The foil or film is subsequently anodized to convert substantially all of the metal into a dielectric (normally an oxide). The anodization process and microcavity placement determine whether adjacent microcavities in an array are electrically connected or not.

A fabrication method of the invention is a wet chemical process in which self-patterned circumferential electrodes are automatically formed around microcavities during an anodization process that converts metal to metal oxide. The size and pitch of the microcavities in a metal foil (or film) prior to anodization, as well as the anodization parameters, determine which of the microcavity plasma devices in a one or two-dimensional array are connected. In a preferred embodiment, a metal foil is obtained or fabricated with microcavities having any of a broad range of cross-sections (circular, square, etc.). The foil is anodized to form metal oxide. One or more self-patterned metal electrodes are automatically formed and simultaneously buried in the metal oxide created by the anodization process. The electrodes form uniformly around the perimeter of each microcavity, and can be electrically isolated or connected in patterns. The shape of the electrodes that form around the microcavities is dependent upon the shape of the microcavities prior to anodization to create the metal oxide. Thus, for example, cylindrical microcavities produce buried ring-shaped electrodes and diamond-shaped microcavities produce essentially diamond-shaped buried electrodes. The electrode around each microcavity is, however, not flush with the microcavity wall. Rather, the electrode is covered by metal-oxide, a portion of which forms the wall of the microcavity.

Preferred embodiment fabrication methods are readily controlled by the parameters of the anodization process to, for example, connect groups of microcavities. Electrodes can be formed so as to ignite an entire group of microcavity plasma devices (such as a row or column of devices in a two dimensional array) or, if desired, a single device in an array. The formation of the self-patterned electrodes and the conversion of metal foil to metal oxide is accomplished entirely in an acid bath. One way to produce an array of devices is to join a thin oxide layer with patterned buried electrodes and microcavities to another thin oxide layer having a buried electrode(s). Fabrication methods of the invention are inexpensive and permit large sheets of material to be processed simultaneously. Addressable and nonaddressable arrays can be formed.

Devices of the invention are amenable to mass production techniques which may include, for example, roll to roll processing to bond together first and second thin layers with buried electrodes. Embodiments of the invention provide for large arrays of microcavity plasma devices that can be made inexpensively. Also, exemplary devices of the invention are formed from thin layers that are flexible and at least partially transparent in the visible region of the spectrum.

The structure of preferred embodiment microcavity plasma devices of the invention is based upon foils (or films) of metal that are available or can be produced in arbitrary lengths, such as on rolls. In a method of the invention, a pattern of microcavities is produced in a metal foil which is subsequently anodized, thereby resulting in microcavities in a metal-oxide (rather than the metal) with each microcavity surrounded (in a plane transverse to the microcavity axis) by a buried metal electrode. During device operation, the metal oxide protects the microcavity and electrically isolates the electrode from the plasma within the microcavity.

A second metal foil is also encapsulated with oxide and can be bonded to the first encapsulated foil. The second metal foil forms a second electrode(s). For one preferred embodiment microcavity plasma device array of the invention, no particular alignment is necessary during bonding of the two encapsulated foils. In another embodiment of the invention, the second electrode comprises an array of parallel metal lines buried in the metal-oxide. The entire array, comprising two metal-oxide layers with buried electrodes, can be sealed with thin glass, quartz, or even plastic windows, for example, with the desired gas or gas mixture sealed within.

Preferred materials for the metal electrodes and metal oxide are aluminum and aluminum oxide ($Al/Al_2O_3$). Another exemplary metal/metal oxide material system is titanium and titanium dioxide ($Ti/TiO_2$). Other metal/metal oxide materials systems will be apparent to artisans. Preferred material systems permit the formation of microcavity plasma device arrays of the invention by inexpensive, mass production techniques such as roll to roll processing.

The shape (cross-section and depth) of the microcavity, as well as the identity of the gas or vapor in the microcavity, the applied voltage and the voltage waveform, determine the plasma configuration and the radiative efficiency of a microplasma, given a specific atomic or molecular emitter. The overall thickness of exemplary microplasma array structures of the invention can be, for example, 200 μm or less, making such arrays very flexible and inexpensive. Furthermore, the density of microcavity plasma devices (number per $cm^2$ of array surface area) can exceed $10^4$ $cm^{-2}$, with filling factors (ratio of the array's radiating area to its overall area) beyond 50% attainable.

Embodiments of the invention provide independent addressing of individual microcavity plasma devices in an array. As noted earlier, in one embodiment the second electrode may comprise one or more arrays of parallel metal lines buried in metal oxide. The entire addressable array consists of two electrodes or electrode patterns, separately buried in metal oxide by anodization and subsequently bonded.

Patterns of electrode interconnections buried in a metal oxide layer provided by the invention also have separate utility as wiring for an electronic device or system. An embodiment of the invention is wiring for an electronic device or system comprising a plurality of microcavities defined in a first metal oxide layer. Circumferential metal first electrodes are buried in the metal oxide layer, each electrode surrounding an individual microcavity. Interconnections buried in the first metal oxide layer connect two or more of the first electrodes. The interconnection of the first electrodes is according to a pattern.

Preferred embodiments will now be discussed with respect to the drawings. The drawings include schematic figures that are not to scale, which will be fully understood by skilled artisans with reference to the accompanying description. Features may be exaggerated for purposes of illustration. From the preferred embodiments, artisans will recognize broader aspects of the invention.

FIG. 1 is a cross-sectional diagram of an example embodiment of microcavity plasma device array 10 of the invention. Microcavities 12 are defined in a first metal oxide layer 15 that includes buried first circumferential electrode(s) 16. The metal oxide 15 protects the first circumferential electrodes 16 from the plasma produced within the microcavities, thereby promoting the lifetime of the array 10, and electrically insulating the circumferential electrodes 16 from the second electrode of the array as well. Notice that circumferential electrodes 16, as shown in cross-section in FIG. 1, are tapered. That is, the thickness of the electrode is the largest in proximity to a microcavity but decreases away from the microcavity. Although not evident in FIG. 1, each circumferential electrode 16 surrounds each respective microcavity and is azimuthally symmetric. Another feature of this embodiment is that a layer of metal-oxide dielectric exists between the inner edge of electrode 16 and the wall of the microcavity 12.

A second electrode 18 in FIG. 1 can be a solid conductive foil and is buried within a second thin oxide layer 19, e.g., metal oxide similar to that of the first layer 15. However, in preferred embodiments, the second electrode 18 is patterned as, for example, parallel lines aligned with the rows (and/or columns) of microcavities 12. In one embodiment, the metal lines are connected electrically. In this way, a common electrode can be formed for a large array of microcavity devices but the amount of metal is reduced compared to a solid conductive foil and the capacitance of the array is thus reduced. In other embodiments, the metal lines may not be connected electrically for the purpose of addressing individual microcavity devices. The second electrode 18 is buried in or encapsulated by oxide 19. The desired discharge medium (gas, vapor, or combination thereof) is contained in the microcavities 12 and microplasmas are produced within the microcavities 12 when a time-varying voltage waveform having the proper RMS value is supplied by generator 22. The driving voltage may be sinusoidal, bipolar DC, or unipolar DC, for example.

The array 10 can be sealed by any suitable material, which can be completely transparent to emission wavelengths produced by the microplasmas or can, for example, filter the output wavelengths of the microcavity plasma device array 10 so as to transmit radiation only in specific spectral regions. The array 10 includes a transparent layer 20, such as a thin glass, quartz, or plastic layer. The discharge medium can be contained at or near atmospheric pressure, permitting the use of a very thin glass or plastic layer because of the small pressure differential across the sealing layer 20. Polymeric vacuum packaging, such as that used in the food industry to seal various food items, may also be used in which case the layer 20 will extend past the edge of 15 and would be sealed to another layer of the same material enclosing array 10 from the bottom. Artisans will appreciate that well-known vacuum and gas handling practices can be used to evacuate air from the sealed array and backfill the array with the desired gas, gases, vapor, or mixture thereof. A vacuum connection (not shown in FIG. 1) can serve this purpose.

It is within each microcavity 12 that a plasma (discharge) will be produced. The first and second electrodes 16, 18 are spaced apart a distance from each other by the respective thicknesses of their oxide layers. The oxide thereby isolates the first and second electrodes 16, 18 from one another and, additionally, isolates each electrode from the discharge medium (plasma) contained in the microcavities 12. This arrangement permits the application of a time-varying (AC, RF, bipolar or pulsed DC, etc.) potential between the electrodes 16, 18 to excite the gaseous or vapor medium to create a microplasma in each microcavity 12.

Figure 2A:
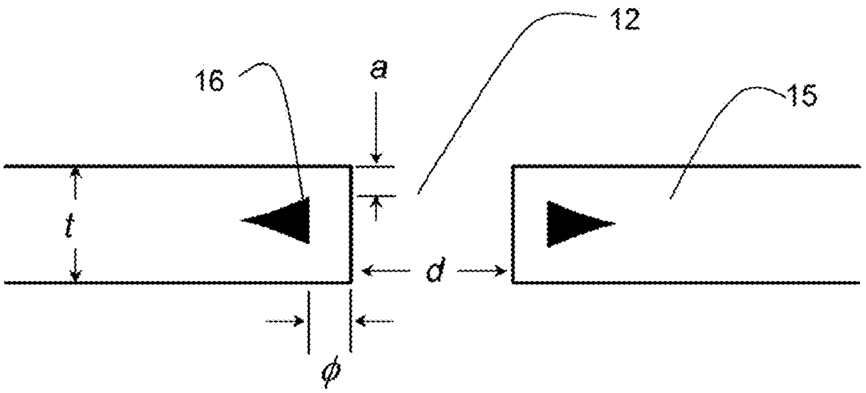
FIG. 2A is a schematic cross-sectional view of an individual microcavity and its associated buried circumferential electrode in cross-section.
Figure 2B:
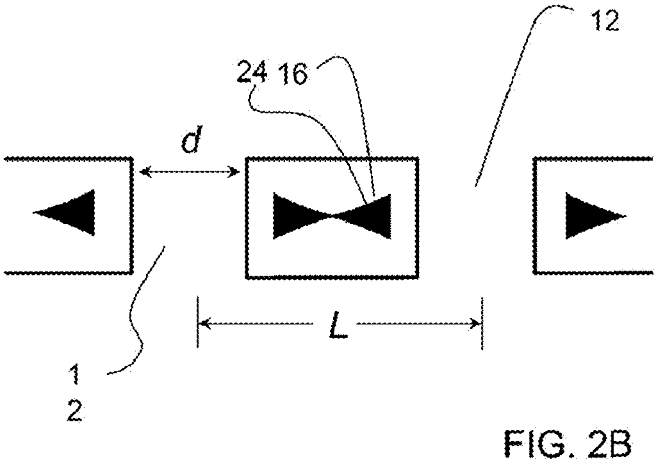
FIG. 2B is a schematic cross-sectional view of a portion of a microcavity array having interconnected buried circumferential electrodes.

FIG. 2 shows an individual cylindrical microcavity 12 of diameter d and buried circumferential electrode 16 in cross-section, and FIG. 2B shows two adjacent microcavities 12 with circumferential electrodes 16 and interconnections 24. The interconnections 24 are continuous with the circumferential electrodes 16 that they connect, being formed by the merger of two circumferential electrodes 16.

Figure 3:
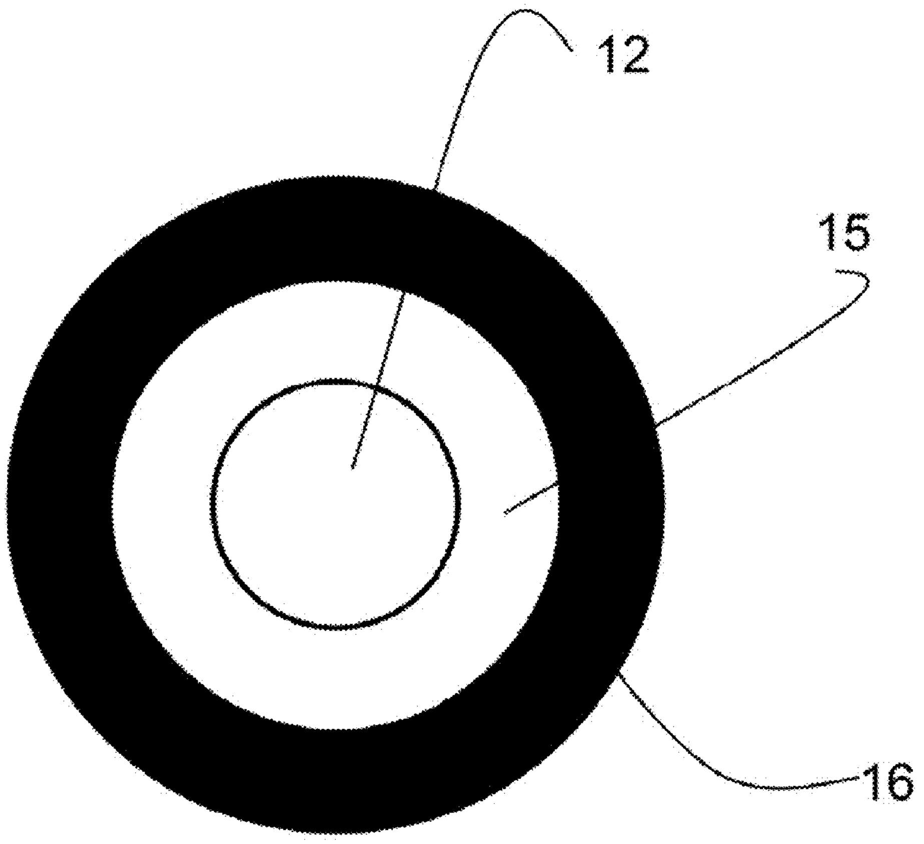
FIG. 3 shows a schematic top view of the individual microcavity and buried circumferential electrode of FIG. 2.

FIG. 3 is a top view of an individual microcavity and buried electrode 16 showing that the buried electrode 16 forms a ring around the microcavity. During formation according to a preferred method, the self-patterned buried circumferential electrodes form automatically around each microcavity, and can be connected in patterns or isolated. As seen in FIGS. 2A, 2B and 3, the electrode 16 is formed such that a layer of metal-oxide dielectric 15 having a thickness $\phi$ exists between the inner edge of electrode 16 and the microcavity wall. Similarly, the thickness of the metal oxide between the top edge of electrode 16 and the upper surface of dielectric layer 15 is a, the total thickness of layer 15 is defined as t, and the diameter of the microcavity is d. In preferred embodiments, $\phi$ typically is in the 1-30 μm range and a is in the 5-40 μm interval. If a is larger than $\phi$, the plasma is generally confined within microcavity 12. While the example embodiment illustrates cylindrical microcavities, self-patterned formation processes of the invention can be used to form microcavities having arbitrary cross-sections (rectangular, diamond, etc.), each microcavity having its own self-patterned buried circumferential electrode.

Artisans will also appreciate that the first electrode 16, as seen in FIGS. 1-3, has utility apart from serving as the first electrode of microcavity plasma device arrays of the invention. Patterns of connections 24 of electrodes 16 buried in a metal oxide 15 provided by the invention also have separate utility, for example, as interconnects (wiring) for an electronic device or system. An embodiment of the invention is wiring for an electronic device or system comprising a plurality of microcavities 12 defined in a first metal oxide layer 15 as seen in FIGS. 1-3. Circumferential first metal electrodes are buried in the metal oxide layer and surround each of the plurality of microcavities 12. Interconnections 24 buried in the first metal oxide layer connect two or more of the first electrodes. The interconnection of the first electrodes is according to a pattern.

In a preferred formation process of the invention, a metal foil having a pattern of microcavities (with the desired cross-sectional geometry) already present, is obtained. The microcavities may extend partially or completely through the metal foil (the latter is illustrated in FIGS. 1, 2A and 2B). A metal foil can have a pattern of microcavities produced in it by any of a variety of techniques, including microdrilling, laser micromachining, chemical etching, or mechanical punching. Foils with pre-formed microcavities in the form of through holes of various shapes are available commercially.

The next step is to convert much of the metal foil into metal oxide by an anodization process. This process is controlled so as to result in self-patterned first electrodes (see FIGS. 1-3) which surround each microcavity. These metal rings around each microcavity, buried in metal oxide, can be connected in various patterns or a single interconnected electrode may be formed, if desired. Through control of the parameters of the anodization process (molar concentration, temperature, process times, etc.), the dimensions of the buried electrodes and interconnections (if any) can be varied and specified.

The method of formation is suitable for large scale processing and is inexpensive. Buried, self-patterned electrodes are formed automatically by anodization, a wet chemical process. Consequently, the process is inexpensive and ideally suited for processing large areas. Producing electrodes for an array by thin film deposition techniques is comparatively expensive. Therefore, while minimizing the equivalent capacitance of a light-emitting array is important to its high-frequency electrical characteristics (such as switching), patterning the electrode by conventional deposition processes raises the cost of the array and the complexity of the fabrication process. With the formation method of the invention, the electrode area can be reduced dramatically without adding complexity to the fabrication process.

FIG. 2*b* shows a diagram of two microcavities and parameters related to the interconnection of buried metal electrodes between the microcavities. For the conditions shown in FIG.

2*a*, the electrodes will be interconnected to one another if the spacing L between the microcavities is smaller than the microcavity diameter d.

Figure 4:
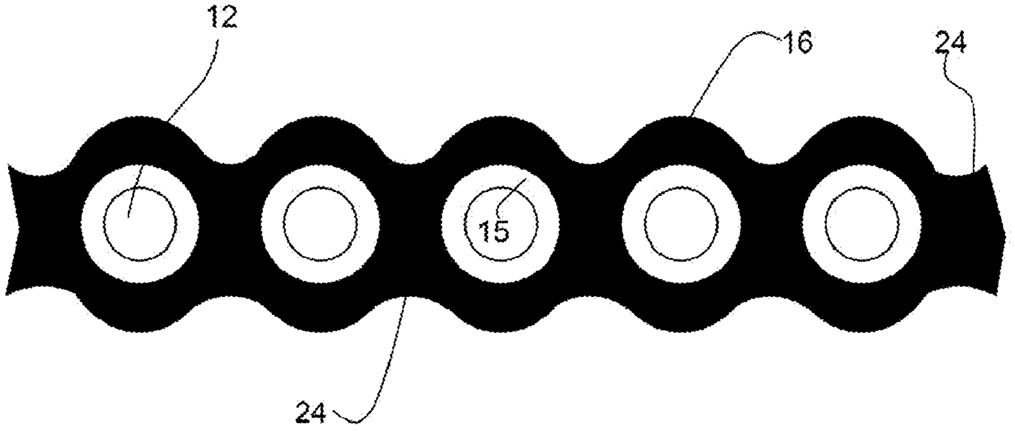
FIG. 4 is a schematic top view of a plurality of microcavities interconnected by buried circumferential electrodes.

Prototype arrays according to exemplary embodiments of the invention have been fabricated and tested. Specifically, linear arrays of microcavity plasma devices have been realized by anodizing in oxalic acid an aluminum foil into which a pattern of cylindrical microcavities (in the form of through holes) has previously been formed. For these exemplary arrays, the thickness of the Al foil is 127 μm, and the diameter and pitch (center-to-center spacing) of the circular holes are 250 μm and 200 μm, respectively. Anodizing the foil in a 0.3 M solution of oxalic acid at 25° C. for 7 hours converts most of the aluminum foil to a nanoporous form of aluminum oxide ($Al_2O_3$) but leaves behind a patterned, thin layer of Al that is buried in the $Al_2O_3$ (as shown in FIG. 2 and FIG. 4). This patterned thin layer of Al is well-suited as an electrode or a group of interconnected electrodes (so as to form a single electrode) to produce microplasmas in the cavities 12 of FIGS. 1-4. Stated another way, the anodization process selectively converts Al into $Al_2O_3$ such that, if the anodization process is terminated at the appropriate time, the remaining Al will serve as electrodes for individual microplasma devices in an array, or as electrodes interconnecting some or all of the microcavities in a microcavity plasma device array. This is the process of forming the array electrode.

The ring structure of the circumferential electrodes formed by this process, shown in cross-section in FIGS. 1, 2A and 2B, is the result of the dynamics of the anodization process near a microcavity in a metal foil or film. Some distance away from the microcavity, anodization of a foil immersed in the anodization bath proceeds uniformly on each side of the foil, e.g., an Al foil, resulting in a thin Al sheet (whose thickness decreases with anodization time), encapsulated in a transparent $Al_2O_3$ film whose thickness increases with processing time. Near the microcavity, however, the process proceeds differently because acid within the microcavity is also participating in anodization. Therefore, in the vicinity of the perimeter of the microcavity, anodization is moving inward from both sides of the foil but, at the same time, it is also proceeding outward, away from the microcavity. However, the conversion of Al into $Al_2O_3$ is slower within the microcavities than outside (i.e., on the surface) because the flow of fresh acid into the small diameter channel (microcavity) is restricted. The result is the Al electrode (FIG. 2A) is flared near the microcavity and an $Al_2O_3$ layer of thickness $\phi$ now lines the microcavity. Also, the inner surface of the electrode—the surface facing the microcavity—is essentially parallel to the microcavity wall. Thus, this process forms a ring electrode that is essentially equidistant from the microcavity wall.

The buried circumferential electrodes form automatically during the anodization process as a result of the flow of oxalic acid to the surface. The arrowhead cross-sectional shape of the metal electrodes that surround the microcavities 12 (see, e.g., FIGS. 1, 2A and 2B) is produced by the nonuniform reaction rate of anodization near the microcavity. Away from the microcavity, the conversion of the metal foil into metal oxide can proceed to near completion (if desired), hut, close to the microcavity, more metal remains because the reaction rate falls near the microcavity owing to the restricted movement of acid into the microcavity (as well as the slow removal of the chemical products of anodization from the microcavity). The result of this process is that self-patterned electrodes, buried in metal oxide, are formed (or, more precisely, left by the anodization process) around the microcavities. It should be emphasized that these formed structures can be modified into various geometries with the implementation of a patterning process or selective anodization techniques (such as those facilitated by masking).

In FIG. 4, buried circumferential electrodes 16 surrounding each microcavity 12 include interconnections 24 to form a single continuous electrode for the linear array of microcavities 12 shown in FIG. 4. In a preferred embodiment, interconnections 24 are the result of the non-separation (or merged nature) of adjacent circumferential electrodes 16 around individual microcavities, which can be used to connect small and large groups of microcavities 12 to form, for example, addressable microcavity plasma device arrays. As described above with respect to preferred formation processes, microcavity spacing and the duration and conditions of the anodizing process can leave interconnections 24 as continuous with adjacent electrodes 16.

Figure 5:
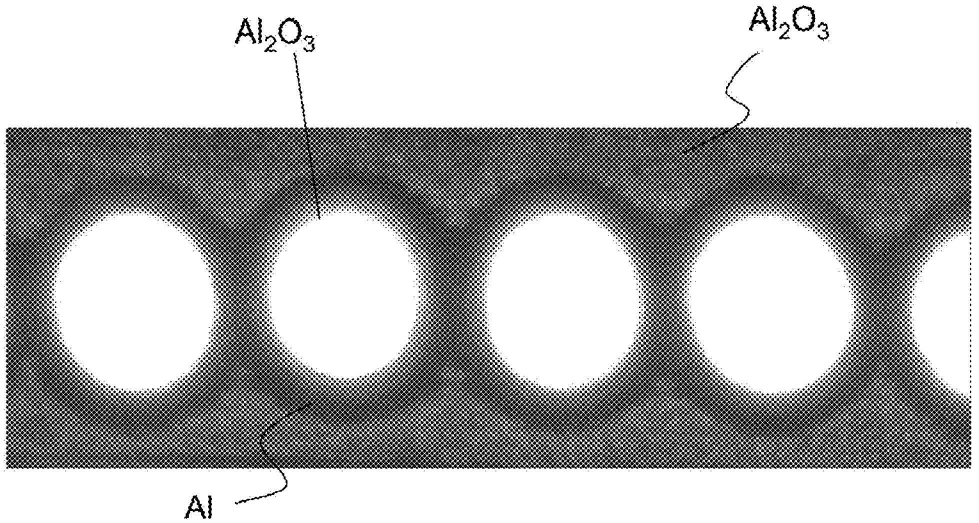
FIG. 5 is a photograph showing a portion of two linear arrays of 250 μm dia. cylindrical microcavities in $Al_2O_3$ with buried circumferential Al electrodes that are connected in a linear pattern.

Experiments have also demonstrated that self-patterned, buried electrodes can be formed to electrically connect arrays of microcavities. A portion of a linear $Al/Al_2O_3$ array of 250 μm dia. microcavities for which the devices are interconnected is shown in FIG. 5. This photograph, taken from above, shows that, on either side of the linear array, Al was essentially completely converted into $Al_2O_3$ which is transparent in the visible region. Also, the buried Al rings around each microcavity (which appear as white circles because the microcavity array is backlit in this photograph) are clearly evident. When operated with 400 Torr of Ne, for example, the arrays of FIG. 5 produce uniform glow discharges in each cavity. Operation at pressures up to approximately one atmosphere has been demonstrated to date and many gases (in addition to Ne) and vapors are well-suited for these microplasma device arrays.

Figure 6:
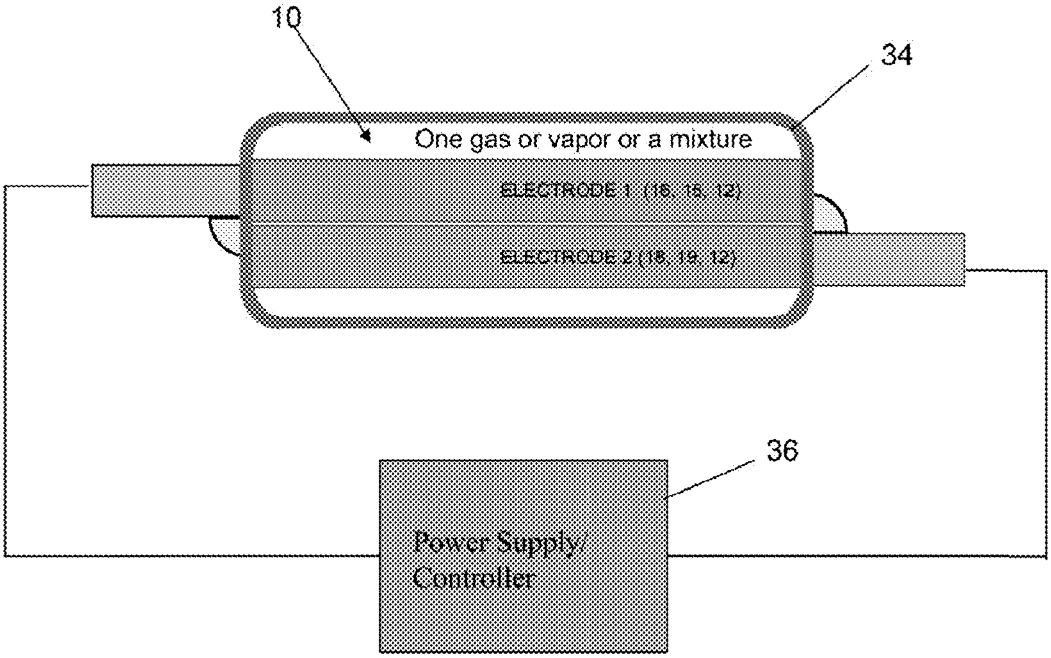
FIG. 6 is a schematic cross-sectional view of an exemplary embodiment microcavity plasma device array of the invention.

FIG. 6 is a diagram of a lamp incorporating an array of microcavity plasma devices of the invention. In the FIG. 6 array, first and second buried electrodes 16, 18 (one or both of which have microcavities 12), for example according to FIG. 1 or 4, are fabricated in metal and metal oxide, e.g., by anodizing pre-formed Al screens to form a microcavity plasma device array 10 with buried circumferential electrodes, which can be sufficiently thin to be flexible. To maintain a high level of flexibility after vacuum sealing, the array 10 can be packaged in polymeric vacuum packaging 34, such as that used by the food industry. Extensions of the electrodes 16, 18 are illustrated as extending beyond the packaging 34 for connection to a power supply/controller 36, while other techniques for connection will be apparent to artisans. Vacuum sealing in polymeric packaging is possible because the microcavity plasma device array 10 can be operated at or near atmospheric pressure, resulting in a small (if any) pressure differential between the inside and outside of the lamp. Of course, other packaging can be employed to seal with a glass, quartz or sapphire window, for example.

Figure 7A:
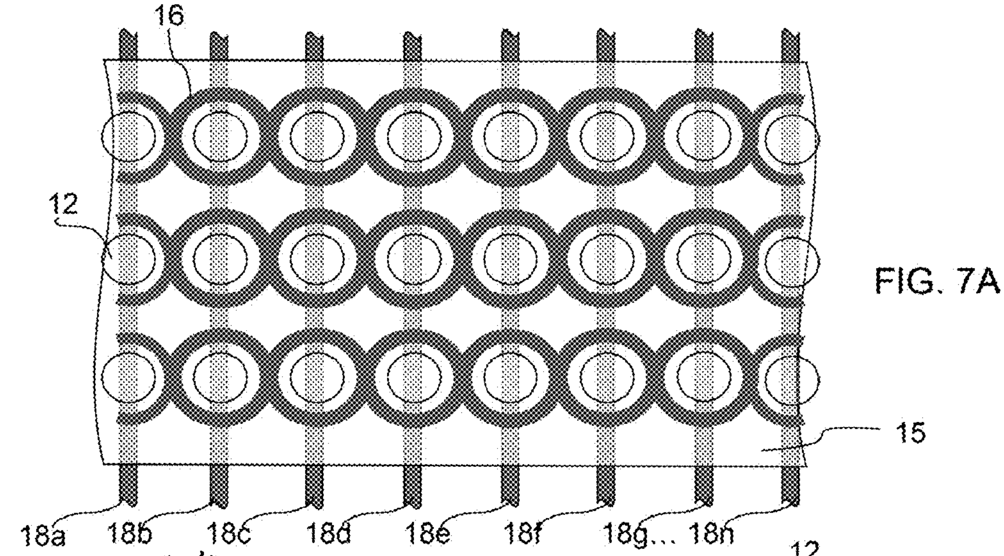
FIGS. 7A and 7B are schematic top and cross-sectional views, respectively, of a preferred embodiment of an array of addressable microcavity plasma devices of the invention.
Figure 7B:
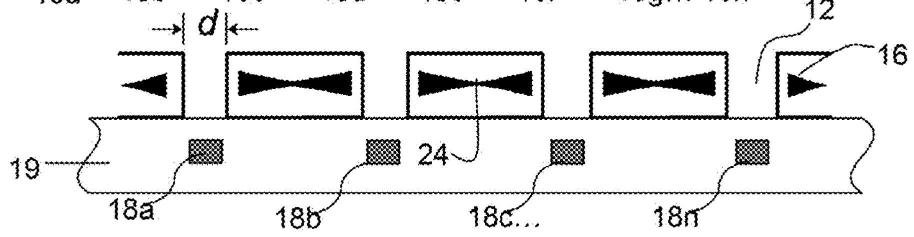

An addressable microcavity plasma device array embodiment of the invention is illustrated schematically in FIGS. 7A and 7B. In FIGS. 7A and 7B, reference numbers from previous figures are used to label comparable parts. The first electrodes 16 in FIGS. 7A and 7B are buried circumferential electrodes in the form of a ring around each microcavity. The electrodes 16 are buried in and protected by a first layer of oxide 15. Interconnections 24 connect linear arrays of electrodes 16 and their respective microcavities 12. The second electrode 18 comprises parallel line electrodes 18*a*-18*n* buried in an oxide layer 19. Electrodes 18*a*-18*n* can be formed by masking the desired regions of the second metal foil prior to anodization. In this way, buried electrodes of the desired width are produced. By aligning line electrodes 18*a*-18*n* with rows and/or columns of microcavities 12 in the first layer of oxide 15, microcavity devices (in a linear or two-dimensional array) are formed which can be addressed individually.

Figure 8A:
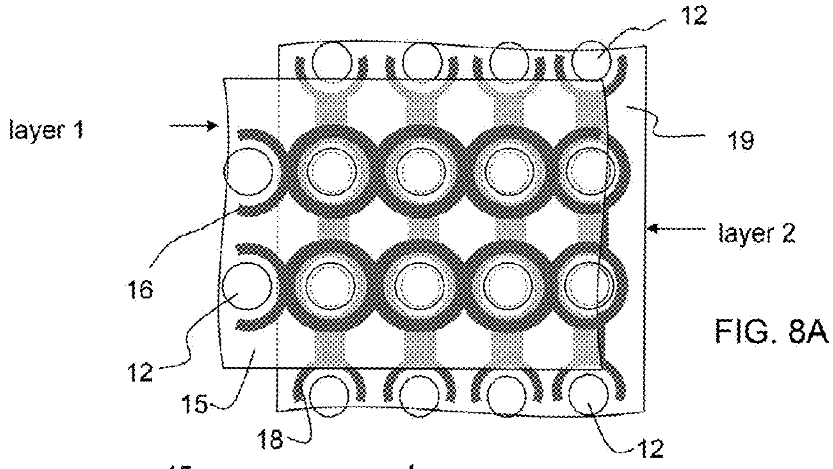
FIGS. 8A and 8B are schematic top and cross-sectional views, respectively, of another preferred embodiment of an array of addressable microcavity plasma devices of the invention.
Figure 8B:
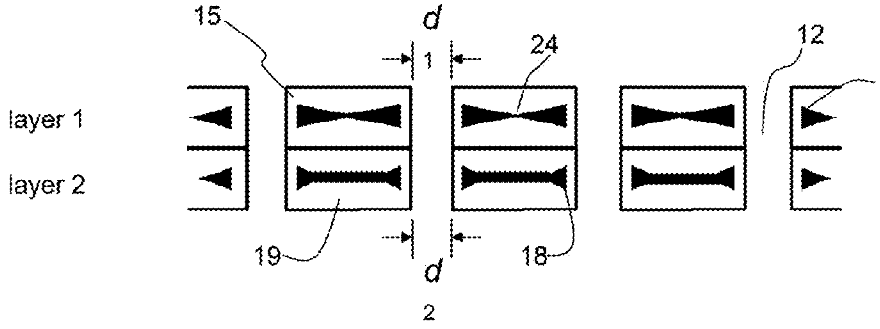

FIGS. 8A and 8B show another addressable microcavity plasma device array embodiment of the invention. In FIGS. 8A and 8B, reference numbers from earlier figures are used to label comparable parts. In FIGS. 8A and 8B, the first electrodes 16 and second electrodes 18 each comprise interconnected buried circumferential electrodes surrounding microcavities 12 formed in both of the oxide layers 15 and 19. The microcavities 12 in the oxide layer 19 can have different diameters than the microcavities 12 in the oxide layer 15, which can aid alignment between electrodes or be used to produce an optimized structure for a flat panel display system, for example. Apart from a microcavity plasma device array, the first and second layers in FIG. 8A can also be used simply as two layers of wiring patterns for circuitry connections in electronic devices or systems.

In FIG. 8B, the electrodes 18 are seen to have a different cross-sectional shape than the buried circumferential electrodes 16. In preferred embodiment addressable arrays, rows of microcavities are separated to avoid cross talk. The second electrodes 18 in FIG. 8B, can be formed initially by the preferred methods described above for the formation of buried circumferential electrodes. A subsequent patterning process (lithography) can be used to create row spacings, and for the extension of metal lines connecting electrodes around microcavities 12.

Figure 9A:
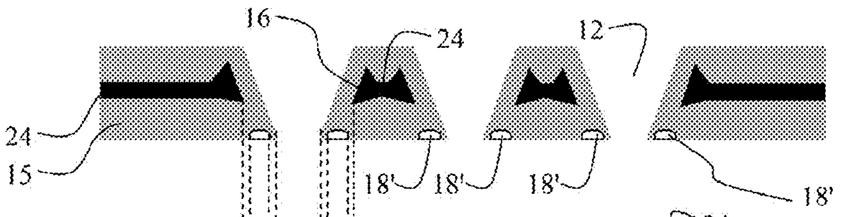
FIGS. 9A and 9B are schematic cross-sectional and top views, respectively, of another preferred embodiment of an array of addressable microcavity plasma devices of the invention.
Figure 9B:
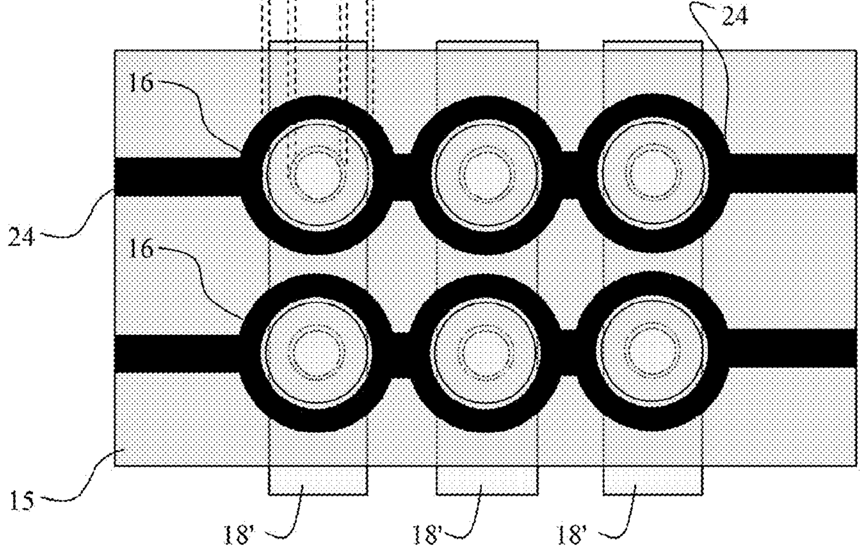

FIGS. 9A and 9B show another microcavity plasma device array of the invention. In the embodiment of FIGS. 9A and 9B, second electrodes 18' are carried by (on or within) the same first metal oxide layer 15 as the first electrodes 16. Fully addressable, interconnected patterns of the first and second electrodes 16, 18' in FIGS. 9A and 9B can be made according to a self assembled fabrication process using a single metal foil, such as an aluminum foil. The second electrodes 18' are carried by the first metal oxide layer at its lower surface (as shown in FIG. 9A). During fabrication, the second electrodes 18' are formed via deposition after completion of the first electrodes/oxide self-assembly process. Advantageously, the use of a single foil layer in FIGS. 9A and 9B permits both the first and second electrodes to be patterned and fully addressable without the need to align two separate oxide/electrode layers during the fabrication process. The second electrodes 18' are generally closer to the microcavities 12 than in other embodiments. Preferably, the second electrodes are recessed into the oxide 15. The embodiment of FIGS. 9A and 9B is capable of generating microplasmas more uniform, and at lower voltages, than those available with the layer oxide embodiments discussed above.

In other embodiments, the oxide 15/electrode 16 layer and second oxide layer 19 are kept sufficiently thin to permit the second electrodes 18 to be sufficiently close to the microcavities to reduce significantly the voltage levels required for exciting the plasma. Since the electrodes 18' of FIG. 9 can be made proximate to the microcavities in the same layer, it is not necessary for the electrode 16/oxide layer 15 to be thin. The embodiment of FIGS. 9A and 9B can also be fabricated from thicker metal foils, which suffer from less bending or stress during the anodization process. Thus, as the array size increases, thicker foils reduce stresses in the array that arise during the anodization process used to convert metal to metal oxide.

As seen in FIG. 9A, the microcavities preferably have a tapered cross section. The tapered shape has advantages for the generation of plasma, and serves in the FIGS. 9A and 9B embodiment to improve the extraction of light, produced by the plasma, from the microcavity. The tapered shape is achieved by wet chemical processes, mechanical punching processes, or other material removal processes.

Figures 10A, 10B, 10C, 10D, 10E:
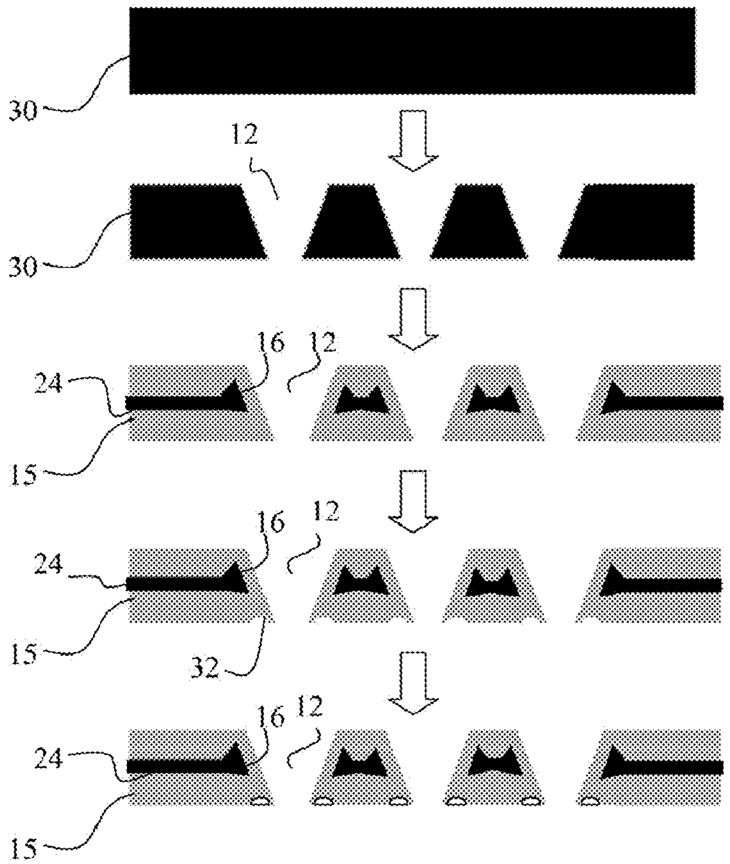
FIGS. 10A-10E illustrate a preferred fabrication process for the array of FIGS. 9A and 9B.

FIGS. 10A-10E illustrate a preferred fabrication process for the array of FIGS. 9A and 9B. The fabrication process begins in FIG. 10A with a metal foil 30 and tapered microcavities 12 are formed in FIG. 10B. FIG. 10C illustrates the formation of first electrodes 16 and interconnects 24 by anodization. If necessitated by the array design, extended interconnects 24 can be formed by photolithography followed by anodization. In FIG. 10D an etching process creates recesses 32 that define locations for the second electrodes 18', which can be deposited, for example, by electroplating or a spatially selective printing process. With the recesses 32, the second electrodes 18' are embedded into the oxide 15, while in other embodiments the second electrodes are formed on the oxide surface. Embedded second electrodes are preferred to place the second electrodes adjacent to the walls of the microcavities 12 in a plane that is transverse to the axes of microcavities 12. The structure shown in FIG. 10C, like other structures that have been illustrated, also has utility as wiring for an electronic device or system. Similarly, the structure of 10E can be used as a dual level electrical interconnect system, completely embedded in $Al_2O_3$, for wiring an electronic device or system.

Arrays of the invention have many applications. Addressable devices can be used as the basis for both large and small high definition displays, with one or more microcavity plasma devices forming individual pixels or sub-pixels in the display. Microcavity plasma devices in preferred embodiment arrays, as discussed above, can excite a phosphor to achieve full color displays over large areas. An application for a non-addressable or addressable array is, for example, as the light source (backlight unit) for a liquid crystal display panel. Embodiments of the invention provide a lightweight, thin and distributed source of light that is preferable to the current practice of using a fluorescent lamp as the backlight. Distributing the light from a localized lamp in a uniform manner over the entire liquid crystal display requires sophisticated optics. Non-addressable arrays provide a lightweight source of light that can also serve as a flat lamp for general lighting purposes. Arrays of the invention also have application, for example, in sensing and detection equipment, such as chromatography devices, and for phototherapeutic treatments (including photodynamic therapy). The latter include the treatment of psoriasis (which requires ultraviolet light at ~308 nm), actinic keratosis and Bowen's disease or basal cell carcinoma. Inexpensive arrays sealed in glass or plastic now provide the opportunity for patients to be treated in a nonclinical setting (i.e., at home) and for disposal of the array following the completion of treatment. These arrays are also well-suited for photocuring of polymers which requires ultraviolet radiation, or as large area, thin light panels for applications in which low-level lighting is desired.

In addition to its application to interconnecting microplasma devices, the formation method of the invention is applicable to generalized wiring, and can be used for forming electrodes and interconnects for microelectronics and MEMs systems, arrays of capacitors, micro-cooling devices and systems, and printed circuit board (PCB) technologies.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

The invention claimed is:

1. A method of manufacturing buried electrodes including a pattern of microcavities, the method comprising steps of:

obtaining or forming a metal foil or film having a plurality of micro-cavities;

anodizing said metal foil or film to convert metal to metal oxide;

continuing said anodizing to form metal oxide protected microcavities and a metal oxide layer from said metal foil;

stopping said anodizing in time to leave metal circumferential electrodes surrounding said microcavities and buried in the metal oxide layer.

2. The method of claim 1, further comprising containing discharge medium in the microcavities to form a microcavity plasma device.

3. The method of claim 2, further comprising joining a second layer containing a second electrode to said first metal oxide layer.

4. The method of claim 3, wherein said step of joining comprises roll-to-roll process bonding of said first and second electrodes.

5. The method of claim 1, wherein said metal foil or film comprises aluminum and said metal oxide comprises aluminum oxide.

6. The method of claim 1, wherein said first and second foils comprise titanium foils and said metal oxide comprises titanium dioxide.

7. The method of claim 1, further comprising a step of forming second electrodes on or near a surface of said metal oxide layer.

8. The method of claim 1, wherein said step of obtaining or forming obtains or forms microcavities that completely through the metal foil or film.

9. A method of manufacturing buried electrodes including a pattern of microcavities, the method comprising steps of:

obtaining or forming a metal foil or film having a plurality of micro-cavities;

anodizing said metal foil or film to convert metal to metal oxide;

continuing said anodizing to form metal oxide protected microcavities and a metal oxide layer from said metal foil;

stopping said anodizing in time to leave metal circumferential electrodes surrounding said microcavities and buried in the metal oxide layer;

forming recesses in a surface of said metal oxide layer; and forming second electrodes in said recesses.

10. A method of manufacturing buried electrodes including a pattern of microcavities, the method comprising steps of:

obtaining or forming a metal foil or film having a plurality of micro-cavities;

anodizing said metal foil or film to convert metal to metal oxide;

continuing said anodizing to form metal oxide protected microcavities and a metal oxide layer from said metal foil;

stopping said anodizing in time to leave metal circumferential electrodes surrounding said microcavities and buried in the metal oxide layer, wherein said step of obtaining or forming obtains or forms microcavities that extend partially through the metal foil or film.

* * * * *

UNITED STATES PATENT AND TRADEMARK OFFICE

CERTIFICATE OF CORRECTION

PATENT NO. : 8,404,558 B2
APPLICATION NO. : 13/188712
DATED : March 26, 2013
INVENTOR(S) : Eden et al.

It is certified that error appears in the above-identified patent and that said Letters Patent is hereby corrected as shown below:

In the Specification:

Col. 11, line 59 Before “close” delete “hut,” and insert --but,-- therefor.

Signed and Sealed this
Thirteenth Day of August, 2013

Teresa Stanek Rea
*Acting Director of the United States Patent and Trademark Office*